(12) United States Patent
England et al.

(10) Patent No.: US 10,236,263 B1
(45) Date of Patent: Mar. 19, 2019

(54) METHODS AND STRUCTURES FOR MITIGATING ESD DURING WAFER BONDING

(71) Applicant: GLOBALFOUNDRIES Inc., Grand Cayman (KY)

(72) Inventors: Luke England, Saratoga Springs, NY (US); Tanya Atanasova, Saratoga Springs, NY (US); Daniel Smith, Ballston Spa, NY (US); Daniel Fisher, Clifton Park, NY (US); Sukeshwar Kannan, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/685,564

(22) Filed: Aug. 24, 2017

(51) Int. Cl.
*H01L 23/60* (2006.01)
*H01L 23/522* (2006.01)
*H01L 23/00* (2006.01)

(52) U.S. Cl.
CPC .......... *H01L 23/60* (2013.01); *H01L 23/5226* (2013.01); *H01L 24/35* (2013.01); *H01L 2223/54493* (2013.01); *H01L 2223/6616* (2013.01)

(58) Field of Classification Search
CPC ............................... H01L 23/60; H01L 24/35
USPC .......................................... 257/774; 438/149
See application file for complete search history.

(56) References Cited

U.S. PATENT DOCUMENTS

| | | | |
|---|---|---|---|
| 7,335,972 B2 | 2/2008 | Chanchani | |
| 7,683,458 B2 | 3/2010 | Akram et al. | |
| 7,956,443 B2 | 6/2011 | Akram et al. | |
| 8,198,736 B2* | 6/2012 | Henderson | H01L 21/67092 257/778 |
| 8,247,895 B2 | 8/2012 | Haensch et al. | |
| 8,390,111 B2 | 3/2013 | Sand | |
| 2010/0059869 A1 | 3/2010 | Kaskoun et al. | |
| 2015/0054090 A1 | 2/2015 | Or-Bach et al. | |
| 2015/0079735 A1* | 3/2015 | Chang | H05F 3/02 438/125 |
| 2015/0303174 A1 | 10/2015 | Yu et al. | |
| 2017/0186658 A1* | 6/2017 | Ramalingam | H01L 23/295 |

(Continued)

OTHER PUBLICATIONS

Global Semiconductor Alliance, Electrostatic Discharge (ESD) in 3D-IC Packages, Version 1.0, Jan. 14, 2015.

*Primary Examiner* — Jami Valentine Miller
(74) *Attorney, Agent, or Firm* — Amerson Law Firm, PLLC

(57) ABSTRACT

One method includes positioning a front side of a first substrate opposite a side of a second substrate, the first substrate comprising an ESD mitigation structure located at an approximate center of the front side, the second substrate comprising at least one TSV structure that extends through the side of the second substrate, the first substrate and the second substrates adapted to be positioned so as to result in the conductive coupling of the at least one TSV structure and the ESD mitigation structure, bending the first substrate to an initial contact position such that an initial engagement between the first substrate and the second substrate will result in conductively coupling between the ESD mitigation structure and the TSV structure, and engaging the first and second substrates with one another such that the ESD mitigation structure and the TSV structure are conductively coupled to one another.

14 Claims, 7 Drawing Sheets

(56) References Cited

U.S. PATENT DOCUMENTS

2017/0207214 A1\* 7/2017 Or-Bach ............. H01L 27/0688
2018/0086627 A1\* 3/2018 Lin ..................... B81C 1/00246
2018/0151541 A1\* 5/2018 Jun ..................... H01L 25/0655

\* cited by examiner

METHODS AND STRUCTURES FOR MITIGATING ESD DURING WAFER BONDING

BACKGROUND OF THE INVENTION

1. Field of the Invention

The present disclosure generally relates to the fabrication of semiconductor devices, and, more particularly, to various novel methods and novel structures for mitigating ESD (electrostatic discharge) during wafer bonding processes.

2. Description of the Related Art

Over the past 40 years, the microelectronic industry has seen a dramatic increase in functionality and performance of Integrated Circuits (ICs). This has largely been due to the phenomenon of "scaling," i.e., component sizes within ICs have been reduced ("scaled") with every successive generation of technology. There is a constant drive to make IC products physically smaller and to increase the performance characteristics of such products, e.g., higher operating speeds, lower power consumption, etc.

One approach that product designers have taken to reduce the overall size of IC products involves bonding multiple substrates to one another, wherein each of the substrates comprise a plurality of individual die formed on a front side of each die. This is sometimes referred to as the 3D stacking of semiconductor chips. This stacking arrangement permits further increases in packing densities for IC products. That is, by arranging transistors in three dimensions instead of two dimensions (a traditional approach in the 1990s), one can place transistors in IC products closer to each other. In one example of such 3D devices, a front side of an upper or top die is bonded to the back side of a lower or bottom substrate. The back side of the bottom substrate is free of any die. The bottom substrate comprises a plurality of TSV (Through-Substrate or Through-Silicon Vias) structures that extend through the back side of the lower substrate. However, as will be appreciated by those skilled in the art, in some applications, the TSV structures are not limited to situations where the TSV structures are positioned in only the bottom substrate. That is, in some applications, e.g., in the case where more than two wafers are being bonded together, the TSV structures may also be present in the top substrate. In one particular example, the back side of the top substrate is typically coupled to a grounded chuck in the wafer bonding tool. The front side of the bottom substrate is typically temporarily attached to a wafer carrier. During the bonding process, the front side of the top substrate is urged into contact with the back side of the bottom substrate.

However, such a wafer-to-wafer bonding process may pose a relatively high risk of damage to one or more of the substrates due to electrostatic discharge (ESD). More specifically, a first capacitor is defined between the vertically spaced apart front side of the top substrate and the back side of the bottom substrate. A second capacitor is defined between the bottom substrate and the carrier substrate. As the top substrate and the bottom substrate are urged closer to one another, the charge on one or both of the first and second capacitors may increase. To the extent there is any electrical charge stored or created on one or both of the top and bottom substrates, such stored or created electrical charge may be discharged as the top and bottom substrates come into contact with one another. This ESD (electrostatic discharge) event may damage one of more of the circuits formed in one or more of the die on the top and/or bottom substrate. The damage due to the ESD event may be so severe that the performance of the IC products on either the top and/or bottom substrates may be adversely impacted or, in a worst case scenario, the functionality of one or more of the die may be destroyed, thereby reducing overall product yields. Efforts to reduce or eliminate the potential damage to 3D devices as a result of ESD events that may occur during the manufacturing process is an important issue to be addressed as packaging and IC products continue to advance.

The present disclosure is directed to various novel methods and novel structures for mitigating ESD (electrostatic discharge) during wafer bonding processes that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods and novel structures for mitigating ESD during wafer bonding processes. One illustrative method disclosed herein includes positioning a front side of a first substrate opposite a side of a second substrate, the first substrate comprising an ESD mitigation structure located at an approximate center of the front side and being positioned within at least one of the scribe lines on the first substrate, the second substrate comprising at least one through-substrate via (TSV) structure that extends through the side of the second substrate, the first substrate and the second substrate adapted to be positioned so as to result in the conductive coupling of the at least one TSV structure and the ESD mitigation structure, and bending the first substrate to an initial contact position such that an initial engagement between the first substrate and the second substrate when they are urged into engagement with one another will result in conductive coupling between the ESD mitigation structure and the at least one TSV structure. In this example, the method further includes, with the first substrate in the initial contact position, engaging the first and second substrates with one another such that the ESD mitigation structure and the at least one TSV structure are conductively coupled to one another.

One illustrative device disclosed herein includes a first substrate that comprises a front side, a plurality of first scribe lines and an ESD mitigation structure located at an approximate center of the front side, wherein the ESD mitigation structure is positioned within at least one of the scribe lines. In this example, the device further includes a second substrate comprising a side, a plurality of second scribe lines and at least one through-substrate via (TSV) structure that extends through at least one of the second scribe lines, wherein the front side of the first substrate is bonded to the side of the second substrate and the at least one TSV structure is conductively coupled to the ESD mitigation structure.

BRIEF DESCRIPTION OF THE DRAWINGS

The disclosure may be understood by reference to the following description taken in conjunction with the accompanying drawings, in which like reference numerals identify like elements, and in which.

Figure 1:
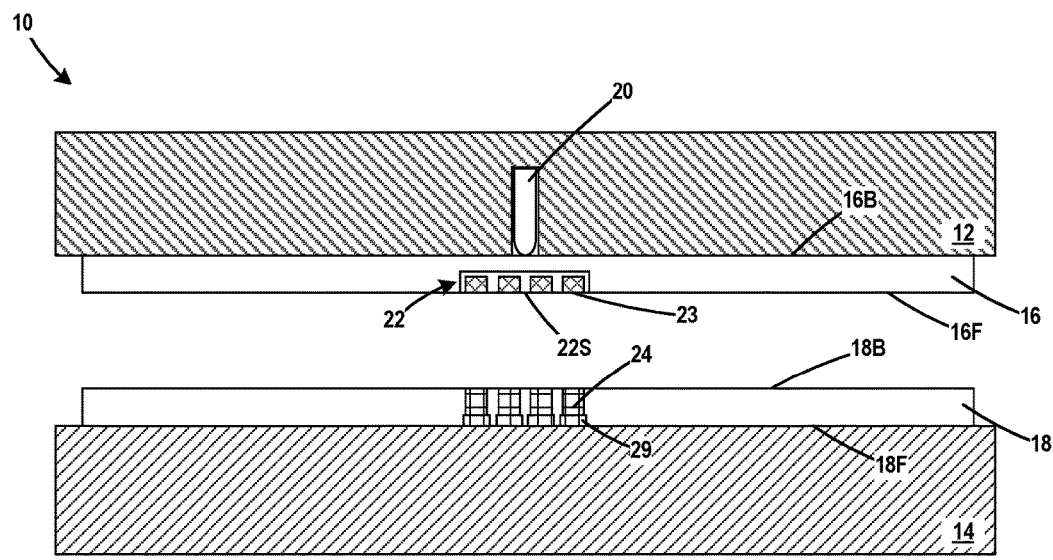
FIGS. 1-13 are drawings that depict aspects of the various novel methods and novel structures for mitigating ESD during wafer bonding processes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods and novel structures for mitigating ESD (electrostatic discharge) during wafer bonding processes. With reference to the attached figures, various illustrative embodiments of the methods and devices disclosed herein will now be described in more detail. The methods disclosed herein may be employed in packaging any type of integrated circuit (IC) product that involves the bonding of multiple substrates to one another.

Figure 2:
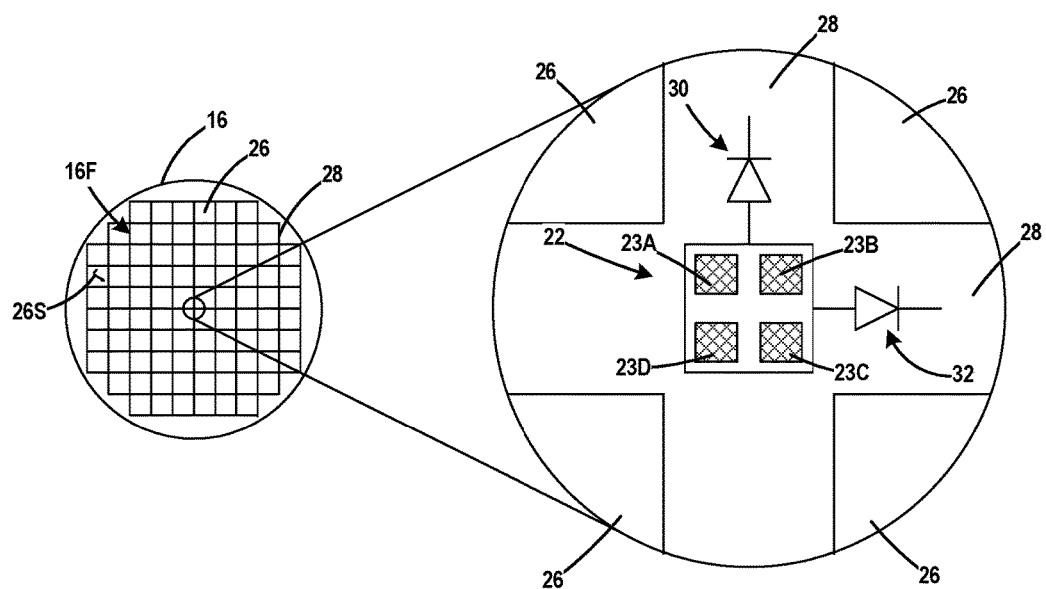
Figure 3:
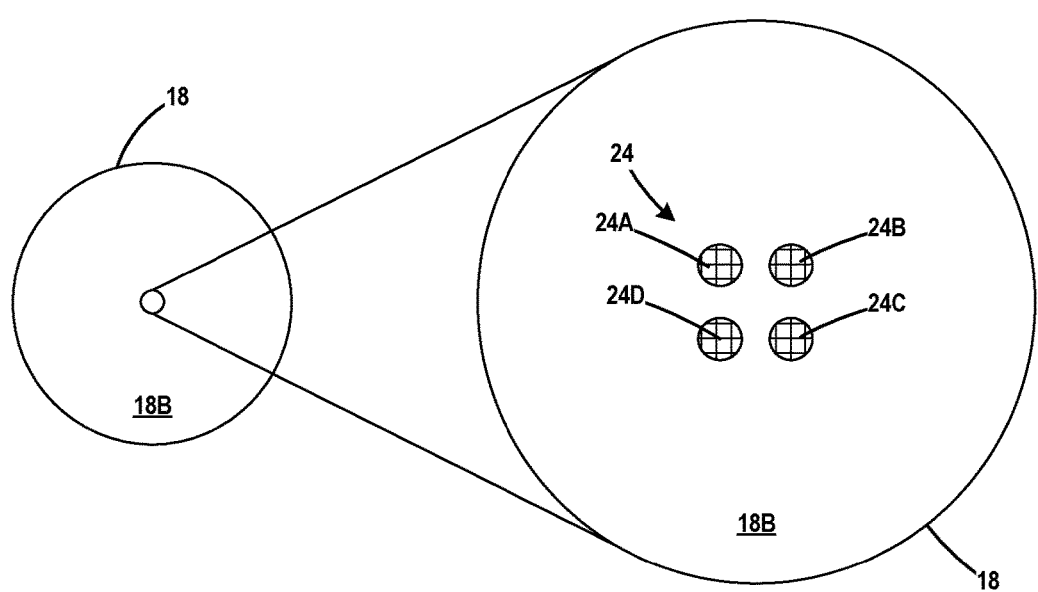

FIGS. 1-3 simplistically depict an illustrative substrate bonding system 10 that may be employed to bond a first substrate 16 to a second substrate 18 while at least mitigating ESD. In the example depicted herein, the first substrate 16 is the top substrate while the second substrate 18 is the bottom substrate. The system comprises a simplistically depicted electrically grounded chuck 12 of a wafer bonding tool with a bond initiating pin 20 positioned in the center of the chuck 12. With reference to FIGS. 1 and 2, the first substrate 16 has a front side 16F with a plurality of die 26 (see FIG. 2) and various BEOL contact structures (not shown) formed on each of the die 26 that are separated by scribe lines 28 (see FIG. 2). As shown in FIG. 1, the first substrate 16 also has a back side 16B that is adapted to engage the chuck 12. The first substrate 16 may be secured to the chuck 12 by a variety of different techniques, e.g., a plurality of clamps (not shown) that engage the outer perimeter of the first substrate 16.

With reference to FIGS. 1 and 3, the second substrate 18 comprises a front side 18F (with a plurality of die (not shown in FIG. 1 or 3) formed on the front side 18F and various BEOL contact structures (not shown) formed on each of the die. The second substrate 18 also has a back side 18B. The front side 18F of the second substrate 18 is temporarily bonded to a carrier wafer or substrate 14 using any of a variety of known prior art techniques. The second substrate 18 is attached to the carrier substrate 14 prior to positioning the second substrate 18 within the wafer bonding tool. As indicated, the back side 18B of the second substrate 18 is positioned opposite the front side 16F of the first substrate 16 when the second substrate 18 is positioned in the wafer bonding tool.

Also schematically depicted in FIGS. 1 and 2 is one illustrative embodiment of a novel ESD mitigation structure 22 that is positioned in the scribe lines 28 in the front side 16F of the first substrate 16. In the depicted embodiment, the ESD mitigation structure 22 is positioned such that the pattern of the contacts 23 is located at approximately the center of the front side 16F of the first substrate 16. Moreover, in the depicted example, the ESD mitigation structure 22 is positioned wholly within the intersection of two scribe lines 28. In other applications, the size and configuration of the ESD mitigation structure 22 may be such that portions of the ESD mitigation structure 22 extend between adjacent die 26. The ESD mitigation structure 22 comprises a plurality of conductive contact structures 23A-D (collectively referred to using the reference numeral 23) formed in the scribe lines 28. It is also possible to have an application wherein, instead of forming a plurality of conductive contact structures 23A-D, a single relatively larger conductive contact structure (not shown) could be formed that would engage either a single TSV or multiple TSVs on the second wafer 18. The ESD mitigation structure 22 also comprises at least first and second diode structures 30, 32 that are schematically depicted in FIG. 2.

In the example shown in FIG. 2, the conductive contact structures 23 are arranged in a substantially rectangular shaped pattern. Of course, the number of conductive contact structures 23, as well as any pattern they are formed in, may vary depending upon the particular application. For example, the conductive contact structures 23 may be arranged in a substantially linear pattern, as depicted in FIG. 1. Note the illustrative rectangular pattern of the conductive contact structures 23 in FIG. 2 does not agree with the schematically depicted linear pattern of the conductive contact structures 23 in FIG. 1, so as to not overly complicate the present drawings. The conductive contact structures 23 may be of any desired form or configuration. In one illustrative example, the conductive contact structures 23 may take the form of BEOL contact pads that are also formed on the die 26. Also note that the upper surface 22S (see FIG. 1) of the ESD mitigation structure 22 is approximately co-planar with the upper surface 26S (see FIG. 2) of the various die 26 formed on the front side 16F of the first substrate 16.

Figure 7:
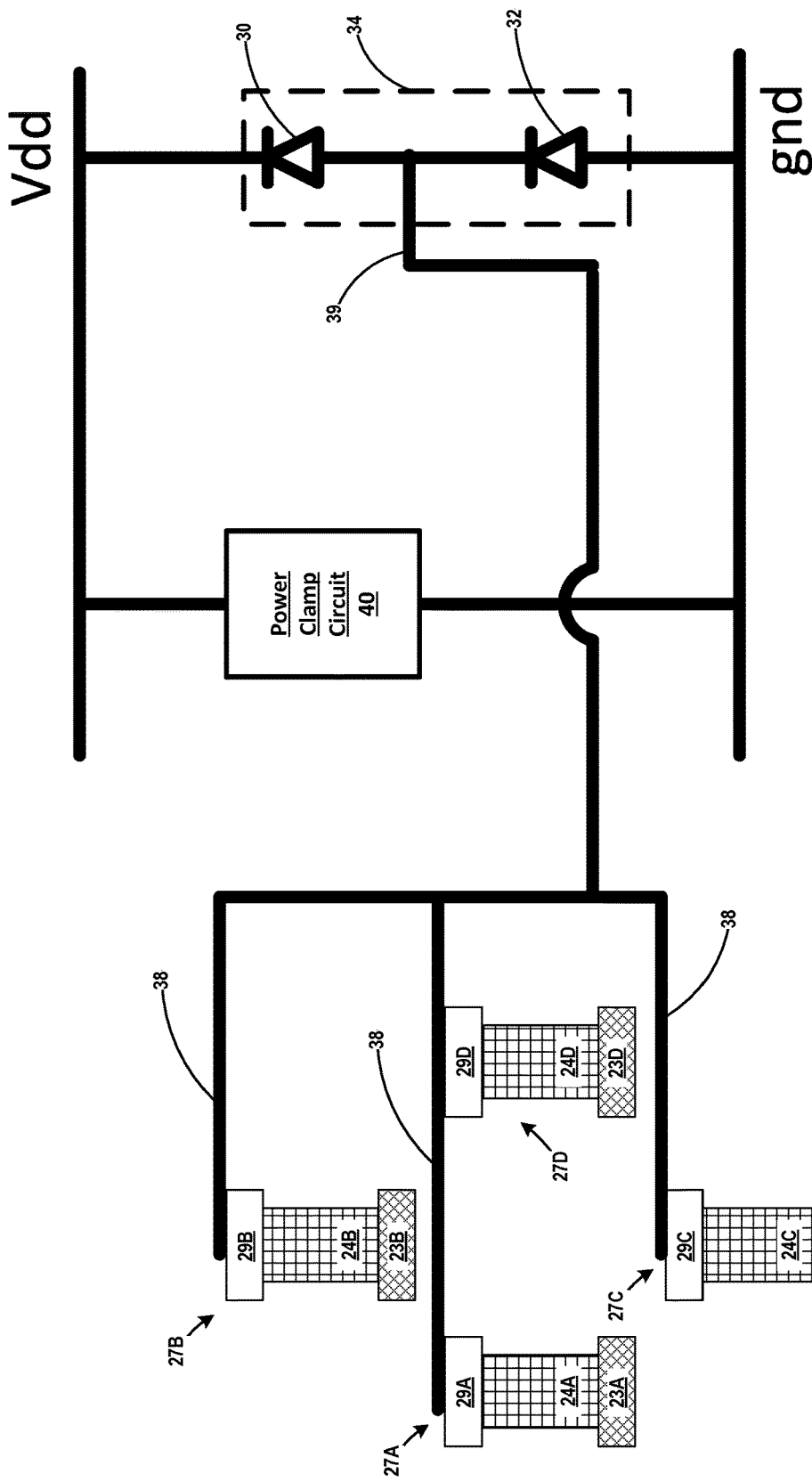

With reference to FIGS. 1 and 3, the second substrate 18 comprises a plurality of schematically depicted TSV structures 24 (Through-Silicon or Through-Substrate Vias) that extend through the back side 18B of the second substrate 18. It is also possible to have an application wherein, instead of forming a plurality of TSV structures 24, a single relatively larger TSV structure (not shown) could be formed that would engage either a single conductive contact structure 23 or multiple conductive contact structures 23 formed on the first substrate 16. However, as the number of contacts between the substrates 16 and 18 decreases, there is a greater risk of discharging an ESD current to the substrate 18 because the peak of the ESD current might be more than the current-carrying capability of the BEOL contact 23 on the ESD structure 22 that engages the TSV structures 24. With reference to FIGS. 1 and 7, the second substrate 18 may also comprise a plurality of TSV contact structures 29A-D (collectively referenced using the numeral 29) that are formed on the front side 18F of the second substrate 18. The TSV contact structures 29 conductively contact (i.e., physically engage) the TSV structures 24. In one illustrative example, the TSV contact structures 29 may take the form of traditional BEOL contact structures that are formed on the front side 18F of the bottom substrate 18.

In the depicted embodiment, the pattern of the TSV structures 24 is positioned at approximately the center of the back side 18B of the second substrate 18. As described more fully below, the patterns of the TSV structures 24 and of the conductive contact structures 23 correspond to one another such that, when the first substrate 16 and the second substrate 18 engage, the conductive contact structures 23 on the front side 16F of the first substrate 16 physically contact the TSV structures 24 on the back side 18B of the second substrate 18 and thereby electrically couple the TSV structures 24 to the ESD mitigation structure 22. That is, in the depicted example, the conductive contact structures 23A, 23B, 23C and 23D are adapted to conductively contact and physically engage with the TSV structures 24A, 24B, 24C and 24D, respectively, when the ESD mitigation structure 22 is urged into engagement with the TSV structures 24. Of course, it is readily appreciated that use of the term "coupling" is meant to encompass situations and arrangements wherein electrical communication is established between the TSV structures 24 and the ESD mitigation structure 22 either by direct physical contact between such components or by virtue of physical contact between various other intermediary structures. In one illustrative embodiment, the ESD mitigation structure 22 and the TSV structures 24 are located and positioned on their respective substrates 16, 18 such that the ESD mitigation structure 22 and the TSV structures 24 will be the first points of physical contact, i.e., physical engagement, between the substrates 16, 18 during the wafer bonding process. In the depicted example, the TSV structures 24 have a generally circular configuration and they are arranged in a generally rectangular pattern. Of course, the number of TSV structures 24, as well as any pattern they are formed in, may vary depending upon the particular application. For example, the TSV structures 24 may be arranged in a substantially linear pattern, as depicted in FIG. 1. Note the illustrative rectangular pattern of the TSV structures 24 in FIG. 3 does not agree with the schematically depicted linear pattern of the TSV structures 24 in FIG. 1, so as to not overly complicate the present drawings.

Figure 4:
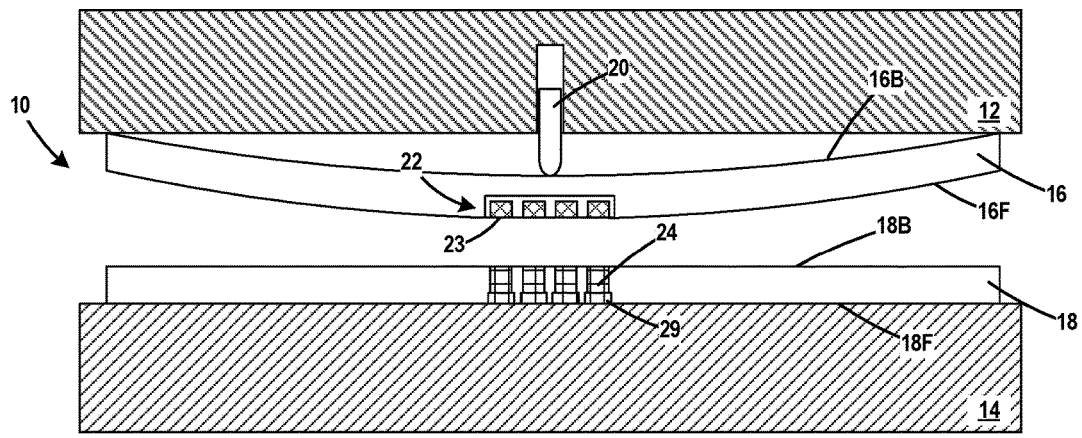

FIG. 1 depicts the substrates 16, 18 after they have been initially positioned in the wafer bonding tool and all operations prior to the actual bonding of the substrates 16, 18 to one another have been performed, e.g., cleaning, application of bonding adhesives, etc. FIG. 4 depicts the system 10 after the bond initiating pin 20 has been extended so as to bend or deflect the first substrate 16 toward the second substrate 18. The bending operation positions the first substrate 16 in an initial contact position whereby when the first substrate 16 and the second substrate 18 initially engage with one another during the bonding process, such engagement will result in the conductive coupling of the ESD structure 22 and the TSV structures 24. In one illustrative example, positioning the ESD structure 22 in the initial contact position insures that the first point of contact between the first substrate 16 and the second substrate 18 will be between the ESD mitigation structure 22 and the TSV structures 24. The ESD mitigation structure 22 will be the first portion of the first substrate 16 to contact the second substrate 18, i.e., the TSV structure 24. The bending process also causes the front side 16F of the first substrate 16 to have a substantially convex or outwardly bulged confirmation so as to position the ESD mitigation structure 22 closer to the TSV structures 24 exposed on the back side 18B of the second substrate 18.

Figure 5:
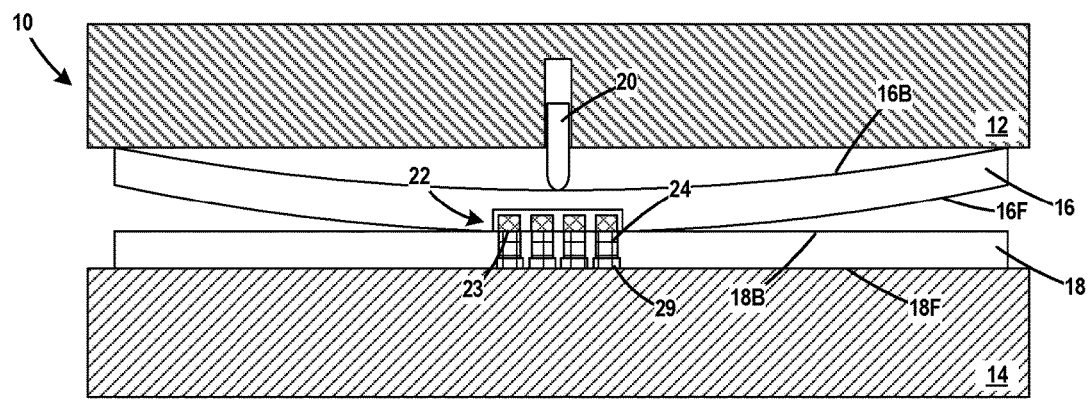

FIG. 5 depicts the system 10 at a point in time that corresponds to the first engagement between the substrates 16, 18, i.e., at a point in time when the conductive contact structures 23 of the ESD mitigation structure 22 make initial contact with the TSV structures 24. This initial contact is made with the bond initiating pin 20 in an extended position. More specifically, for the illustrative embodiment disclosed herein, FIG. 5 depicts the substrates at a point in time where the conductive contact structures 23A, 23B, 23C and 23D have individually and separately physically engaged the TSV structures 24A, 24B, 24C and 24D, respectively. This initial engagement between the substrates 16, 18 can be accomplished by moving the first substrate 16 down toward the second substrate 18, or vice versa, or by moving both of the substrates 16, 18 toward one another at the same time. Additionally, although the sequence in the drawings depicts the bond initiating pin 20 as being fully extended prior to moving the substrates 16, 18 relative to one another, in practice, the bond initiating pin 20 may be extended at the same time as one or both of the substrates 16, 18 are moved so as to contact one another.

Figure 6:
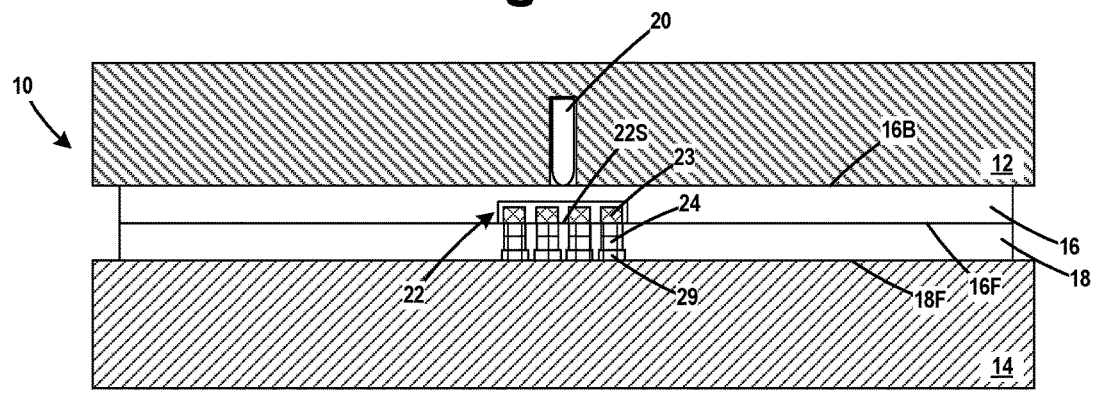

FIG. 6 depicts the system 10 after the substrates 16, 18 have been fully engaged with one another and the bond initiating pin 20 has been retracted. At that point in time, various operations may be undertaken to fully bond the front side 16F of the first substrate 16 to the back side 18B of the second substrate 18. At that point in time, the now-bonded substrates 16, 18 may be removed from the wafer bonding tool. At some point later in the manufacturing process, a dicing process will be performed so as to separate the now stacked die on the combined (i.e., bonded together) substrates 16, 18 from other stacked die on the combined substrates 16, 18 by cutting the combined substrates 16, 18 along the scribe lines. Additional packaging operations may then be performed on each of the separated stacked dies so as to produce a completed IC product that may be commercially sold. During the dicing process, some or all portions of the ESD mitigation structure 22 and/or the TSV structures 24 may be destroyed. It should also be noted that the location of the TSV structures is not limited to the second (bottom) substrate 18. For example, another set of similar TSV structures (not shown) may be formed so as to extend through the back side 16B of the front substrate 16 in the case where three or more wafers are bonded together.

FIG. 7 is a simplistic circuit layout for one illustrative embodiment of the ESD mitigation structure 22 disclosed herein. FIG. 7 schematically depicts a point in time where the individual conductive contact structures 23A, 23B, 23C and 23D on the first substrate 16 have individually and separately conductively engaged the TSV structures 24A, 24B, 24C and 24D, respectively, that extend through the back side 18B of the second substrate 18. In the depicted example, the pattern of the conductive contact structures 23 and the TSV structures 24 is such that there are four pairs 27A-D of such electrically coupled structures (collectively referenced using the numeral 27). In the depicted example, a plurality of conductive wiring lines 38 are conductively engaged to the TSV contact structures 29A-D formed on the front side 18F of the second substrate 18 so as to couple the electrically coupled structures 27 to one another. The output of the electrically coupled structures 27, i.e., any electrostatic charge that may be present between the substrates 16, 18 at the time of the initial contact between the ESD mitigation structure 22 and the TSV structures 24 (as described above), flows via line 39 to the above-described diodes 30, 32 that are arranged back-to-back (as indicated in the dashed line region 34). This arrangement enables the discharge of electrostatic energy that may be generated or stored on one or both of the substrates 16, 18 before or during the wafer bonding process. A traditional power clamp circuit 40 with a triggering transistor device (not shown) is arranged electrically parallel with the back-to-back diodes 30, 32. The triggering transistor within the power clamp circuit 40 ensures that the power clamp circuit 40 is turned "ON" during the entirety of any electrical discharge event (e.g., 500 ns-1 µs) so as to enable complete discharge of electrostatic energy during the bonding process. The triggering transistor also turns the power clamp circuit 40 "OFF" at the completion of the electrical discharge event.

In the example depicted above, the ESD mitigation structure 22 was formed on the front side 16F of the first substrate 16 and the TSV structures 24 were formed so as to extend through the back side 18B of the second substrate 18, i.e., a front-to-back wafer bonding arrangement. However, as will be appreciated by those skilled in the art after a complete reading of the present application, the novel methods and structures disclosed herein may be employed wherein the front face 16F of the first substrate 16 is bonded to the front face 18F of the second substrate 18, i.e., a front-to-front wafer bonding arrangement. The ESD mitigation structure 22 may be formed in the scribe lines 28 on the front face 16F of the first substrate 16 or in the scribe lines 52 (see FIG. 10) on the front face 18F of the second substrate 18. Additionally, in this front-to-front bonding arrangement, the TSV structures 24 may extend through scribe lines 28 on the front face 16F of the first substrate 16 or through the scribe lines 52 on the front face 18F of the second substrate 18.

Figure 8:
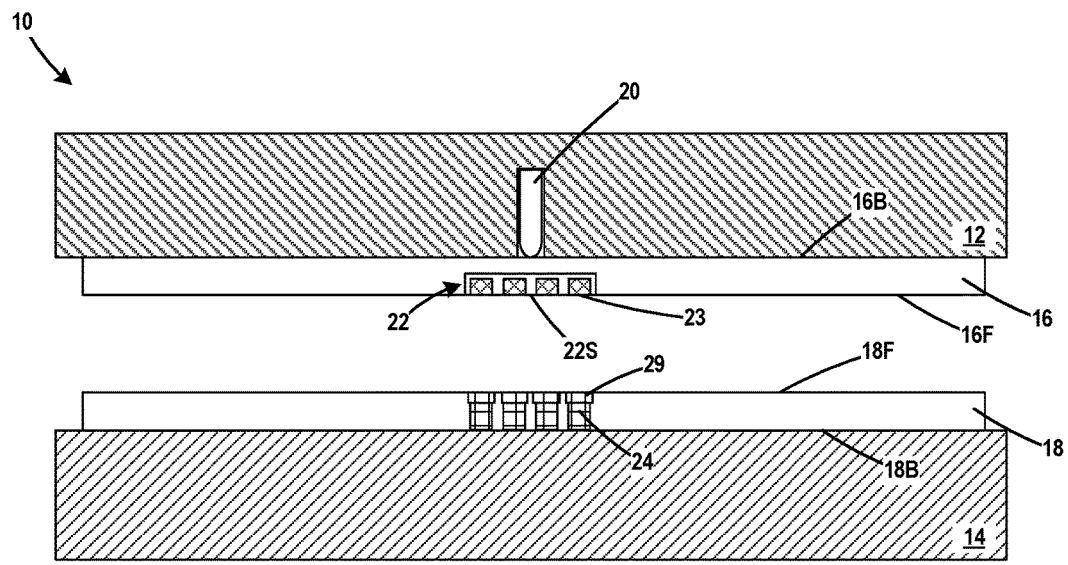
Figure 9:
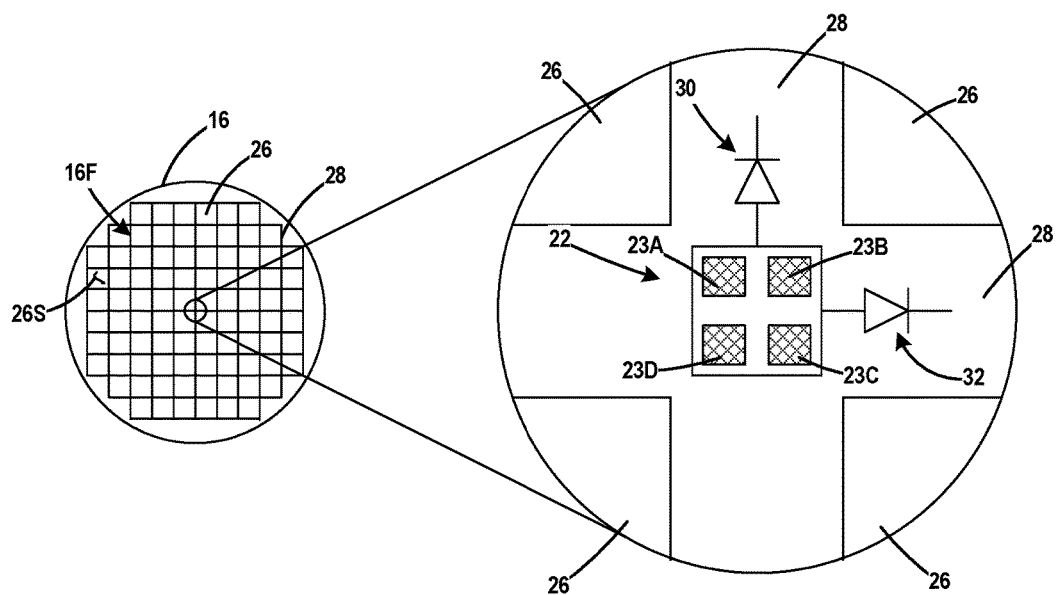
Figure 10:
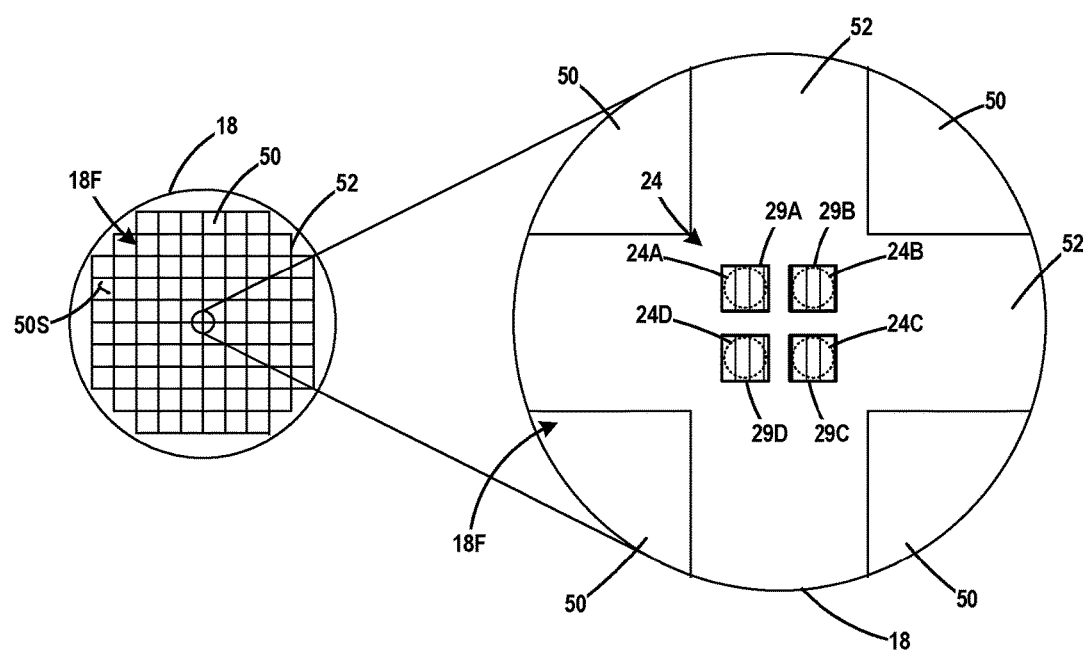

FIGS. 8-13 depict an illustrative example of such a face-to-face bonding arrangement. More specifically, with reference to FIGS. 8 and 9, in the depicted example, the ESD mitigation structure 22 is positioned in the scribe lines 28 (see FIG. 9) on the front side 16F of the first substrate 16. The ESD mitigation structure 22 is positioned such that the pattern of the conductive contacts 23 for the ESD structure 22 is located at approximately the center of the front side 16F of the first substrate 16. With reference to FIGS. 8 and 10, the second substrate 18 has a front side 18F with a plurality of die 50 (see FIG. 10) and various BEOL contact structures (not shown) formed on each of the die 50. The die 50 are separated by scribe lines 52 (see FIG. 10). In this example, the TSV contact structures 29A-D and the underlying TSV structures 24A-D are positioned in the scribe lines 52 in the front side 18F of the second substrate 18. The pattern of the TSV contact structures 29A-D and the TSV structures 24 (shown in dashed lines in FIG. 10) is located at approximately the center of the front face 18F. The upper surfaces of TSV contact structures 29A-D will be positioned approximately co-planar with the upper surface 50S (see FIG. 10) of the various die 50 formed on the front face 18F of the second substrate 18. Of course, as noted above, in such a front-to-front substrate bonding arrangement, the ESD mitigation structure 22 may be positioned on either the first substrate 16 or the second substrate 18, and the TSV contact structures 29 may be positioned on the other of the first substrate 16 or the second substrate 18.

Figure 11:
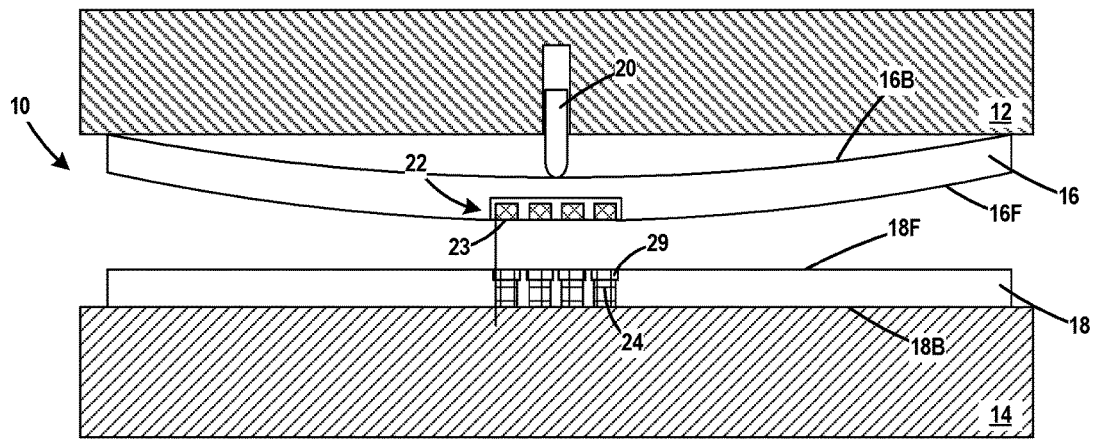
Figure 12:
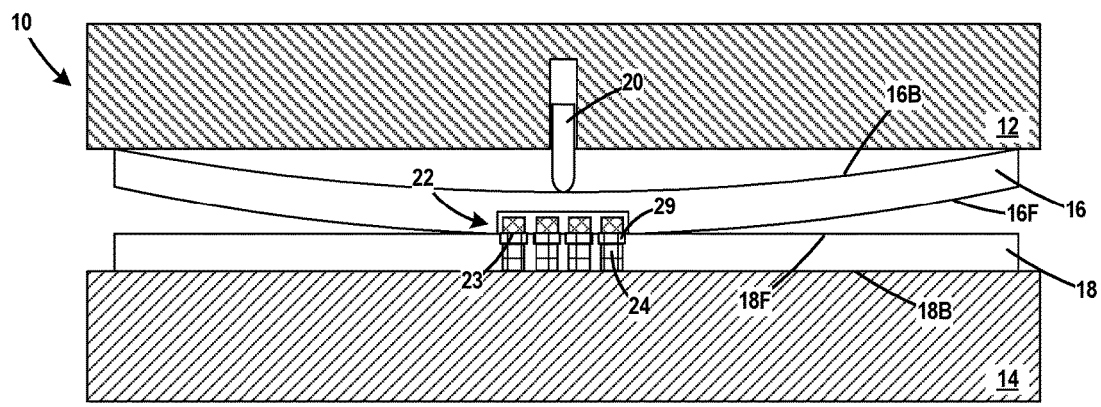
Figure 13:
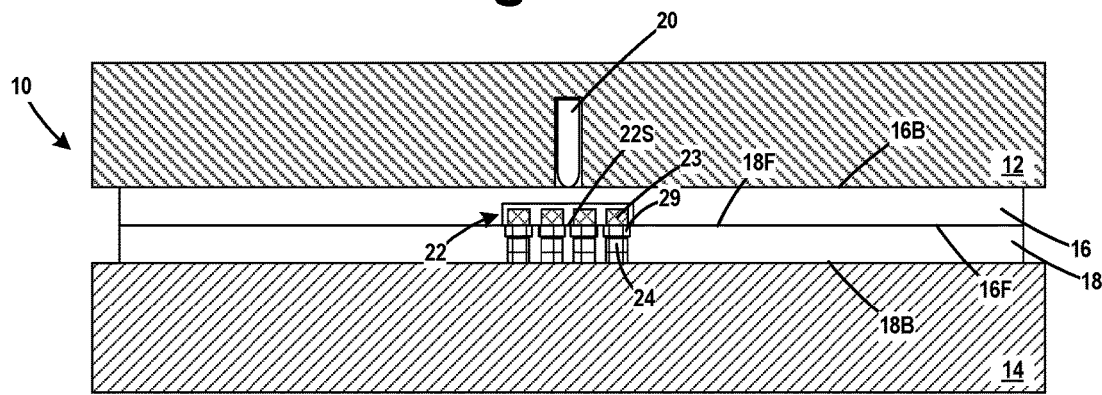

FIG. 8 depicts the substrates 16, 18 after they have been initially positioned in the wafer bonding tool and all operations prior to the actual bonding of the substrates 16, 18 to one another have been performed, e.g., cleaning, application of bonding adhesives, etc. FIG. 11 depicts the system 10 after the bond initiating pin 20 has been extended so as to bend or deflect the front face 16F of the first substrate 16 toward the front face 18F of the second substrate 18. The bending operation positions the first substrate 16 in the above-described initial contact position. FIG. 12 depicts the system 10 at a point in time that corresponds to the first engagement between the substrates 16, 18, i.e., at a point in time when the conductive contact structures 23 of the ESD mitigation structure 22 make initial physical contact with the TSV contact structures 29A-D, so as to thereby result in the conductive coupling of the TSV structures 24 and the ESD mitigation structure 22. FIG. 13 depicts the system 10 after the substrates 16, 18 have been fully engaged with one another and the bond initiating pin 20 has been retracted. At that point in time, various operations may be undertaken to fully bond the front side 16F of the first substrate 16 to the front side 16F of the second substrate 18. At that point in time, the now-bonded substrates 16, 18 may be removed from the wafer bonding tool. At some point later in the manufacturing process, a dicing process will be performed so as to separate the now stacked die on the combined (i.e., bonded together) substrates 16, 18 from other stacked die on the combined substrates 16, 18 by cutting the combined substrates 16, 18 along the scribe lines. Additionally, in such a face-to-face bonding situation, both of the substrates 16, 18 may have already been thinned to their desired final thickness and they may be bonded to one another without having to temporarily bond one of them to a carrier structure 14.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
positioning a front side of a first substrate opposite a side of a second substrate, wherein said first substrate comprises a plurality of first scribe lines, said first substrate comprising an ESD mitigation structure located at an approximate center of said front side, said ESD mitigation structure being positioned within at least one of said plurality of first scribe lines, said second substrate comprising at least one through-substrate via (TSV) structure that extends through said side of said second substrate;
bending said first substrate to an initial contact position, wherein, in said initial contact position, an initial engagement between said first substrate and said second substrate will result in said ESD mitigation structure and said at least one TSV structure being conductively coupled to one another; and
with said first substrate in said initial contact position, engaging said first and second substrates with one another such that said ESD mitigation structure and said at least one TSV structure are conductively coupled with one another.

2. The method of claim 1, wherein said first substrate is coupled to a chuck of a wafer bonding tool, wherein said side of said second substrate is a back side of said second substrate and wherein bending said first substrate to said initial contact position comprises extending a bonding initiating pin positioned in said chuck such that said bonding initiating pin engages a back side of said first substrate at an approximate center of said back side of said first substrate.

3. The method of claim 2, wherein, when said first substrate is in said initial contact position, said front side of said first substrate has a convex configuration.

4. The method of claim 1, wherein said side of said second substrate is a back side of said second substrate, wherein said ESD mitigation structure comprises at least one conductive contact and wherein engaging said first and second substrates with one another causes said at least one conductive contact to physically engage said at least one TSV structure so as to conductively couple said ESD mitigation structure to said at least one TSV structure.

5. The method of claim 1, wherein said ESD mitigation structure comprises a plurality of conductive contact structures arranged in a first pattern and said at least one TSV structure comprises a plurality of individual TSV structures that are arranged in a second pattern, wherein said first and second patterns are substantially a same pattern.

6. The method of claim 1, wherein said side of said second substrate is a back side of said second substrate and wherein said ESD mitigation structure comprises four individual conductive contact structures arranged in a first pattern and said at least one TSV structure comprises four individual TSV structures that are arranged in a second pattern, wherein said first and second patterns are substantially a same pattern, and engaging said first and second substrates with one another causes said four individual conductive contact structures to physically engage said four individual TSV structures so as to conductively couple said ESD mitigation structure to said TSV structures.

7. The method of claim 6, wherein said first pattern is a rectangular pattern.

8. The method of claim 1, wherein said ESD mitigation structure comprises a substantially planar contact surface, wherein said first substrate comprises a plurality of individual first die positioned on said front side, each of said plurality of individual first die having a substantially planar upper surface, wherein said substantially planar contact surface of said ESD mitigation structure is positioned substantially coplanar with said substantially planar upper surfaces of said plurality of individual first die and wherein engaging said first and second substrates with one another causes said substantially planar contact surface to physically engage said at least one TSV structure.

9. The method of claim 1, wherein said side of said second substrate is a back side of said second substrate.

10. The method of claim 1, wherein said side of said second substrate is a front side of said second substrate, and wherein said second substrate further comprises at least one TSV contact structure that is conductively coupled to said at least one TSV structure, and wherein said ESD mitigation structure comprises at least one conductive contact that is adapted to physically engage said at least one TSV structure and wherein engaging said first and second substrates with one another causes said at least one TSV structure to physically engage said at least one conductive contact on said ESD mitigation structure.

11. The method of claim 2, further comprising:
retracting said bonding initiating pin;
further urging said first and second substrate into engagement such that said front side of said first substrate fully engages said side of said second substrate; and
bonding said first and second substrates to one another so as to form a combined substrate.

12. A method, comprising:
positioning a front side of a first substrate opposite a side of a second substrate, said first substrate comprising an ESD mitigation structure located at an approximate center of said front side in at least one of a plurality of first scribe lines on said first substrate, said second substrate comprising a plurality of individual through-substrate via (TSV) structures positioned in at least one of a plurality of second scribe lines on said second substrate, wherein said ESD mitigation structure comprises a plurality of conductive contact structures on said first substrate arranged in a first pattern and wherein said plurality of individual TSV structures on said second substrate are arranged in a second pattern, wherein said first and second patterns are substantially a same pattern;
bending said first substrate to an initial contact position wherein, in said initial contact position, said front side of said first substrate has a convex configuration such that an initial engagement between said first substrate and said second substrate will result in conductive coupling between said plurality of conductive contact structures on said ESD mitigation structure on said first substrate and said plurality of individual TSV structures on said second substrate; and
with said first substrate in said initial contact position, engaging said first and second substrate with one another such that said plurality of conductive contact structures on said ESD mitigation structure and said plurality of individual TSV structures are conductively coupled to one another.

13. The method of claim 12, wherein said side of said second substrate is a back side of said second substrate and wherein said plurality of conductive contact structures of said ESD mitigation structure physically contact said plurality of TSV structures.

14. The method of claim 12, wherein said side of said second substrate is a front side of said second substrate and wherein said second substrate further comprises a plurality of TSV contact structures, each of said plurality of TSV contact structures being individually coupled to one of said plurality of individual TSV structures, and wherein, when said first and second substrates are engaged with one another, said plurality of conductive contact structures of said ESD mitigation structure physically contact said plurality of individual TSV structures.

* * * * *